(12) United States Patent
Adamson et al.

(10) Patent No.: US 6,725,713 B2
(45) Date of Patent: Apr. 27, 2004

(54) SYSTEM FOR GENERATING ELECTRIC POWER FROM A ROTATING TIRE'S MECHANICAL ENERGY USING REINFORCED PIEZOELECTRIC MATERIALS

(75) Inventors: John David Adamson, Simpsonville, SC (US); George Phillips O'Brien, Piedmont, SC (US)

(73) Assignee: Michelin & Recherche et Technique S.A. (CH)

( * ) Notice: Subject to any disclaimer, the term of this patent is extended or adjusted under 35 U.S.C. 154(b) by 0 days.

(21) Appl. No.: 10/345,040

(22) Filed: Jan. 15, 2003

(65) Prior Publication Data

US 2003/0209064 A1 Nov. 13, 2003

Related U.S. Application Data

(63) Continuation-in-part of application No. 10/143,535, filed on May 10, 2002.

(51) Int. Cl.[7] .......................... G01M 17/02; B60C 23/02
(52) U.S. Cl. ........................... 73/146.5; 73/146
(58) Field of Search ..................... 73/146, 146.2, 73/146.5, 146.3, 146.8; 152/415, 416, 417, 152.1; 340/441–447

(56) References Cited

U.S. PATENT DOCUMENTS

| 5,749,984 A | * | 5/1998 | Frey et al. ............... 152/415 |
| 5,781,104 A | | 7/1998 | Huang |
| 5,846,354 A | * | 12/1998 | Winston et al. .......... 152/418 |
| 6,175,302 B1 | | 1/2001 | Huang |

FOREIGN PATENT DOCUMENTS

| GB | 2307044 A | 5/1997 |
| GB | 2325303 A | 11/1998 |
| WO | 0168388 | 9/2001 |
| WO | 0180327 | 10/2001 |

OTHER PUBLICATIONS

EPO Search Report dated Aug. 26, 2003.
US patent application Publication No.; US 2003/0011276 A1 Pub. Date: Jan. 16, 2003.

* cited by examiner

Primary Examiner—William Oen
(74) Attorney, Agent, or Firm—Dority & Manning, P.A.

(57) ABSTRACT

A system for generating electric power from a rotating tire's mechanical energy concerns a power generation device with a piezoelectric structure and an energy storage device. The piezoelectric structure preferably comprises a plurality of piezoelectric fibers embedded in a generally unidirectional fashion within an epoxy matrix. The piezoelectric structure may be mounted on a support substrate that helps distribute mechanical strain to which the piezoelectric fibers are subjected in a substantially uniform fashion. The piezoelectric structure is preferably mounted within a tire structure such that electric charge is generated therein as the wheel assembly moves along a ground surface. Electrode layers within the piezoelectric structure are coupled to a power conditioning module that rectifies the resultant electric current from the piezoelectric structure and stores it in an energy storage device, preferably an electrolytic capacitor. A rechargeable battery may also be provided for storing additional charge generated within the piezoelectric structure. A regulated voltage source is provided from the energy stored in the power generation device and can be used to power various electronics systems integrated within a tire or wheel assembly. An example of an integrated tire electronics system for use with the disclosed power generation device corresponds to a tire monitoring system that wirelessly transmits such information as tire pressure, temperature and identification variables to a remote receiver location.

33 Claims, 8 Drawing Sheets

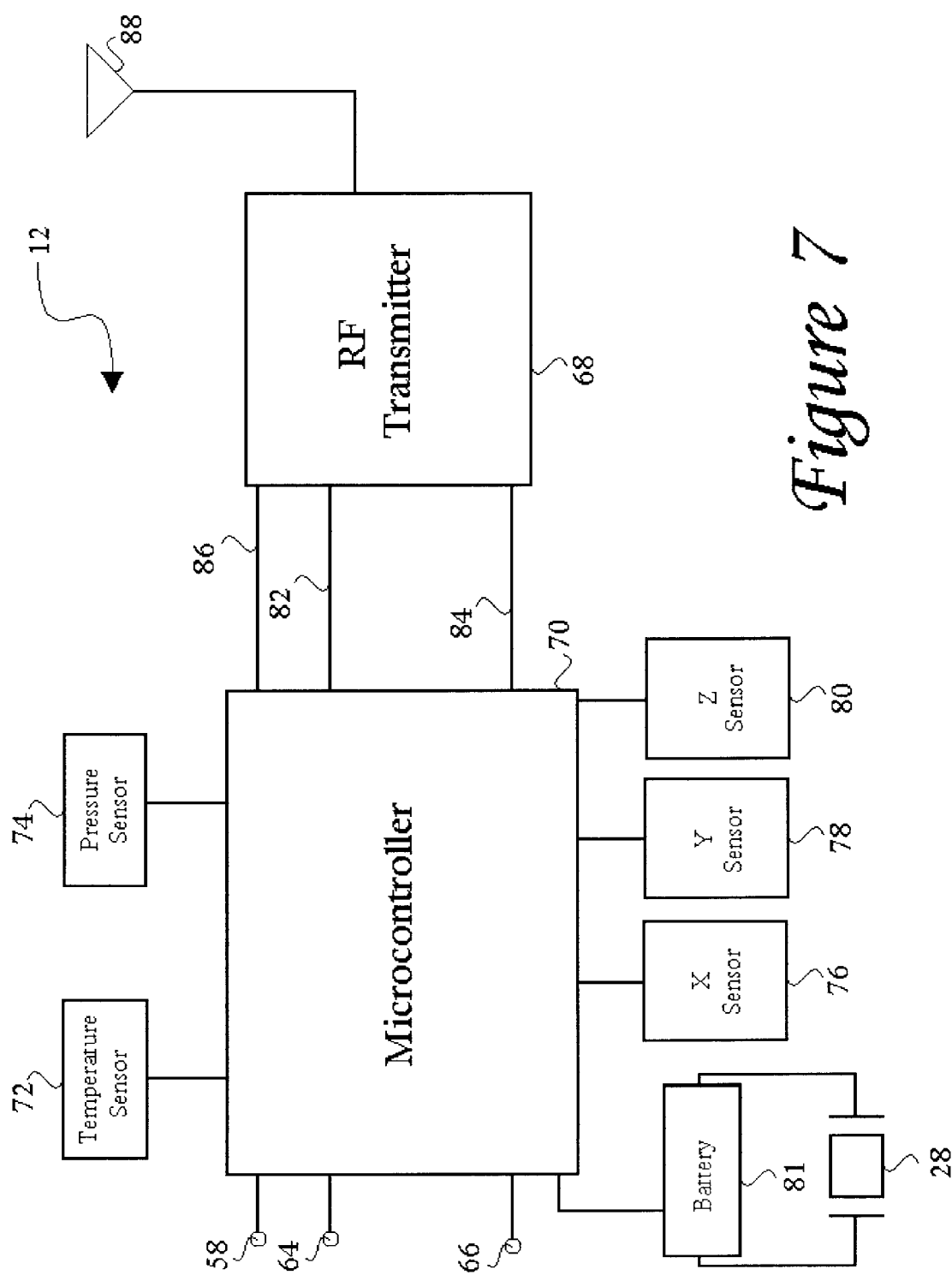

SYSTEM FOR GENERATING ELECTRIC POWER FROM A ROTATING TIRE'S MECHANICAL ENERGY USING REINFORCED PIEZOELECTRIC MATERIALS

PRIORITY CLAIM

This application is a Continuation-In-Part of previously filed U. S. Patent Application entitled "SYSTEM AND METHOD FOR GENERATING ELECTRIC POWER FROM A ROTATING TIRE'S MECHANICAL ENERGY USING PIEZOELECTRIC FIBER COMPOSITES," with the same inventors as present, assigned U.S. Ser. No. 10/143,535, filed on May 10, 2002, and which is incorporated herein by reference for all purposes.

FIELD OF THE INVENTION

The present invention generally concerns a system and method for subjecting piezoelectric structures to the mechanical energy of conventional tire rotation, thereby generating electric power for integrated tire electronics. Piezoelectric technology is utilized to convert mechanical strain associated with tire flexure to electric charge that is then conditioned and stored in an energy storage device. Sufficient accumulations of such stored energy can then power electronic systems including components for identifying various physical tire parameters as well as radio frequency (RF) transmission devices.

BACKGROUND OF THE INVENTION

The incorporation of electronic devices with pneumatic tire structures yields many practical advantages. Tire electronics may include sensors and other components for obtaining information regarding various physical parameters of a tire, such as temperature, pressure, number of tire revolutions, vehicle speed, etc. Such performance information may become useful in tire monitoring and warning systems, and may even potentially be employed with feedback systems to regulate proper tire pressure levels.

U.S. Pat. No. 5,749,984 (Frey et al.) discloses a tire monitoring system and method that is capable of determining such information as tire deflection, tire speed, and number of tire revolutions. Another example of a tire electronics system can be found in U.S. Pat. No. 4,510,484 (Snyder), which concerns an abnormal tire condition warning system. U.S. Pat. No. 4,862,486 (Wing et al.) also relates to tire electronics, and more particularly discloses an exemplary revolution counter for use in conjunction with automotive and truck tires.

Yet another potential capability offered by electronics systems integrated with tire structures corresponds to asset tracking and performance characterization for commercial vehicular applications. Commercial truck fleets, aviation crafts and earthmover/mining vehicles are all viable industries that could utilize the benefits of tire electronic systems and related information transmission. Tire sensors can determine the distance each tire in a vehicle has traveled and thus aid in maintenance planning for such commercial systems. Vehicle location and performance can be optimized for more expensive applications such as those concerning earth mining equipment. Entire fleets of vehicles could be tracked using RF tag transmission, exemplary aspects of which are disclosed in U.S. Pat. No. 5,457,447 (Ghaem et al.).

Such integrated tire electronics systems have conventionally been powered by a variety of techniques and different power generation systems. Examples of mechanical features for generating energy from tire movement are disclosed in U.S. Pat. No. 4,061,200 (Thompson) and U.S. Pat. No. 3,760,351 (Thomas). Such examples provide bulky complex systems that are generally not preferred for incorporation with modern tire applications. Yet another option for powering tire electronics systems is disclosed in U.S. Pat. No. 4,510,484 (Snyder), which concerns a piezoelectric reed power supply symmetrically configured about a radiating center line of a tire.

Another typical solution for powering tire electronics systems corresponds to the use of a non-rechargeable battery, which inherently provides an inconvenience to the tire user since proper electronics system operation is dependent on periodic battery replacement. Conventional batteries also often contain heavy metals that are not environmentally friendly and which present disposal concerns, especially when employed in highly numerous quantities. Still further, batteries tend to deplete their energy storage quite rapidly when powering electronic applications characterized by complex levels of functionality. Battery storage depletion is especially prevalent in electronic systems that transmit information over a relatively far distance such as from truck wheel locations to a receiver in the truck cabin. Even when batteries are used in electronics systems that transmit from wheel locations to a closer receiver location, information is then typically relayed via hard-wire transmission medium from the RF receiver location to the vehicle cab thus requiring the installation of additional and often expensive communications hardware in a vehicle.

Yet another known method for deriving power for tire monitoring systems relates to scavenging RF beam power with an interrogation antenna in close proximity to a tire and integrated electronic features. Energy that is radiated from the antenna is scavenged to power the electronics, which must often be very specialized ultra-low-power electronics limited to within a few microwatts. Interrogation antennas employed in conjunction with beam-powered electronics must typically be placed in relatively close proximity (within about two feet) to each wheel well due to limited transmission ranges. This typically requires multiple interrogation antennas per vehicle, thus adding to potential equipment costs. Each antenna is also quite susceptible to damage from road hazards, and thus for many reasons may not be the most desirable solution for powering certain tire electronic applications.

In accordance with the present subject matter, it is appreciated that certain advantages of piezoelectric materials have long been recognized. However, such technology is constantly improving, thus potentially affording applications that utilize piezoelectric materials with improved operating capabilities. Examples of relatively new advances in piezoelectric technology are provided in U.S. Pat. No. 5,869,189 (Hagood, IV et al.) and U.S. Pat. No. 6,048,622 (Hagood, IV et al.), directed to composites for structural control. The presently disclosed technology concerns further advances in piezoelectric technology such that a piezoelectric power generating device can be integrated with a tire or wheel assembly for purposes of energy harvesting. Given that piezoelectric materials are often highly susceptible to excessive strain levels, additional aspects of the present invention help ensure that such integrated piezoelectric materials are reinforced to decrease strain levels and the risk of material damage.

The disclosures of all of the foregoing United States patents are hereby fully incorporated into this application for all purposes by reference thereto. While various tire electronics systems and power generation systems therefor have been developed, no design has emerged that generally encompasses all of the desired characteristics as hereafter presented in accordance with the subject technology.

BRIEF SUMMARY OF THE INVENTION

In view of the recognized features encountered in the prior art and addressed by the present subject matter, an improved system and method for powering electronic systems integrated within a tire structure has been developed. Piezoelectric technology is utilized to convert mechanical strains associated with tire flexure to electric charge that is then conditioned and stored in an energy storage device. Sufficient accumulations of such stored energy can then power various electronics components within a tire, including a radio frequency (RF) device to wirelessly relay information from within a tire.

In accordance with more particular aspects of the disclosed technology, it is an object of the present subject matter to provide a pneumatic tire with integrated self-powered electronic components. Such electronic components receive power from integrated piezoelectric structures and may correspond to such components as a rechargeable battery, a revolution counter, an active RFID transponder, etc. A still further electronic application concerns an electronics assembly designed to measure and transmit information regarding tire conditions such as pressure and temperature, as well as other information such as the number of tire revolutions or general tire identification variables. Variety is also afforded to the type of piezoelectric material employed in the subject integrated piezoelectric structures. Exemplary piezoelectric materials include quartz, barium titanate, cadmium sulfide, lead zirconate titanate (PZT), polyvinylidene fluoride (PVDF), and polyvinyl chloride (PVC).

In accordance with additional particular aspects of the present technology, various features are employed in combination with the subject piezoelectric structures to reinforce the structures and decrease the risk of damage thereto. This is particularly advantageous in some instances since piezoelectric materials integrated with a tire structure may often be subjected to levels of strain that cause breaks or cracks in the piezoelectric material, thus reducing the structure's efficiency of even capability of operation. One reinforcement feature utilized in some embodiments of the technology relates to a collective configuration of piezoelectric fibers that are aligned together and surrounded by a resin matrix of epoxy or polymer. By embedding the fibers in such a resin matrix, the overall mechanical strain to which the piezoelectric materials are subjected is distributed among the structure. Additional distribution of mechanical strain can be achieved by mounting the piezoelectric structure to a support substrate that provides uniform stiffness against the structure.

Various features and aspects of the subject tire electronics system and specialized power generating device offer a plurality of advantages. The disclosed technology provides for a self-powered tire electronics system that is not dependent on replacement of batteries. Although batteries and battery-operated devices may still be incorporated with aspects of the present subject matter, many complications regarding tire electronics that are solely powered by batteries are obviated in accordance with the disclosed technology.

Another advantage of the present subject matter is that a tire monitoring system is provided that reduces the amount of required signal hardware relative to conventional tire monitoring systems. By providing a tire monitoring system that is self-powered, no scavenger antennas or multiple receiver locations with additional hardwire connections are required. Components of such a tire monitoring system can be integrated within each individual tire structure on a given vehicle such that a single receiver (typically located in a vehicle cabin) is capable of acquiring information transmitted by each tire's integrated electronics.

Yet another advantage of the present subject matter is that there are fewer limitations regarding the type and amount of electronic equipment capable of utilization within tire and wheel assembly structures. Tire electronics powered by conventional methods other than as in accordance with the disclosed piezoelectric technology are often limited to ultra-low power devices. Devices in accordance with the disclosed technology are not necessarily subject to such extreme power limitations. This advantage further facilitates greater functionality of tire electronics, as more components and/or higher-level equipment may potentially be utilized.

A still further advantage of the present subject matter is that the disclosed system and method for generating power and utilizing such power can be used in accordance with a variety of existing applications. Measurement capabilities, monitoring and warning systems, vehicle feedback systems, and asset tracking potential may be possible for applications such as commercial truck fleets, airplanes, and mining/earthmover equipment.

In one exemplary embodiment of the present subject matter, a tire assembly with integrated self-powered electronic components comprises a pneumatic tire structure, a patch of piezoelectric material, an energy storage device, and an electronics package. More preferably, the pneumatic tire structure is characterized by a crown having an exterior tread portion for making contact with a ground surface, bead portions for seating the tire to a wheel rim, exterior sidewall portions extending between each bead portion and the crown, and an inner liner along interior crown and sidewall surfaces. The patch of piezoelectric material is integrated with a selected portion of the pneumatic tire structure and is configured to generate electric charge when the pneumatic tire structure is subjected to mechanical strains, such as those caused by tire rotation. The energy storage device is preferably configured to receive the charge generated in the patch of piezoelectric material and to store selected amounts of such charge therein. An electronics package may then be connected to the energy storage device such that selected functionality of the electronics package is powered by the electric charge from the energy storage device.

Additional embodiments of the present technology may include selected features of the aforementioned exemplary embodiment in combination with various reinforcement features. In accordance with one such exemplary reinforcement feature, the patch of piezoelectric material comprises a composite structure of piezoelectric fibers that are embedded in an epoxy matrix thus helping to distribute the strain load experienced by the piezoelectric fibers. Yet another reinforcement feature of the present subject matter corresponds to a support substrate, such as one made of fiberglass, to which the patch of piezoelectric material may be attached, also facilitating a more uniform distribution of strain among the piezoelectric material.

Another exemplary embodiment of the present technology concerns an electronics assembly for integration with a pneumatic tire structure designed to measure and transmit information relating to preselected tire conditions. More particularly, such an electronics assembly may comprise an active piezoelectric fiber composite, a support substrate, a power conditioning module, a plurality of sensors, a microcontroller, and an RF transmitter. The piezoelectric structure may be characterized by a plurality of piezoelectric fibers embedded in an epoxy matrix and provided between at least two electrode layers, such embodiment preferably being either adhered to an interior portion of the pneumatic tire structure or mounted and cured within the tire structure itself. The power conditioning module is electrically coupled to selected electrode layers such that it receives electric current generated within the piezoelectric fibers and stores the current in an energy storage device until it is selectively provided as a regulated voltage output. The plurality of sensors are powered by the regulated voltage output and determine information regarding preselected tire conditions. The RF transmitter is electrically connected to and receives information from the microcontroller to modulate on a carrier signal and transmit to a remote receiver location. Such exemplary electronics assembly may also include a rechargeable battery configured to receive the regulated voltage output.

Additional objects and advantages of the present subject matter are set forth in, or will be apparent to, those of ordinary skill in the art from the detailed description herein. Also, it should be further appreciated that modifications and variations to the specifically illustrated, referred and discussed features and steps hereof may be practiced in various embodiments and uses of the invention without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the present subject matter, not necessarily expressed in this summarized section, may include and incorporate various combinations of aspects of features, components, or steps referenced in the summarized objectives above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which:

FIG. 7 provides a block diagram representation of an exemplary tire electronics system in accordance with the disclosed technology.

Figure 1:
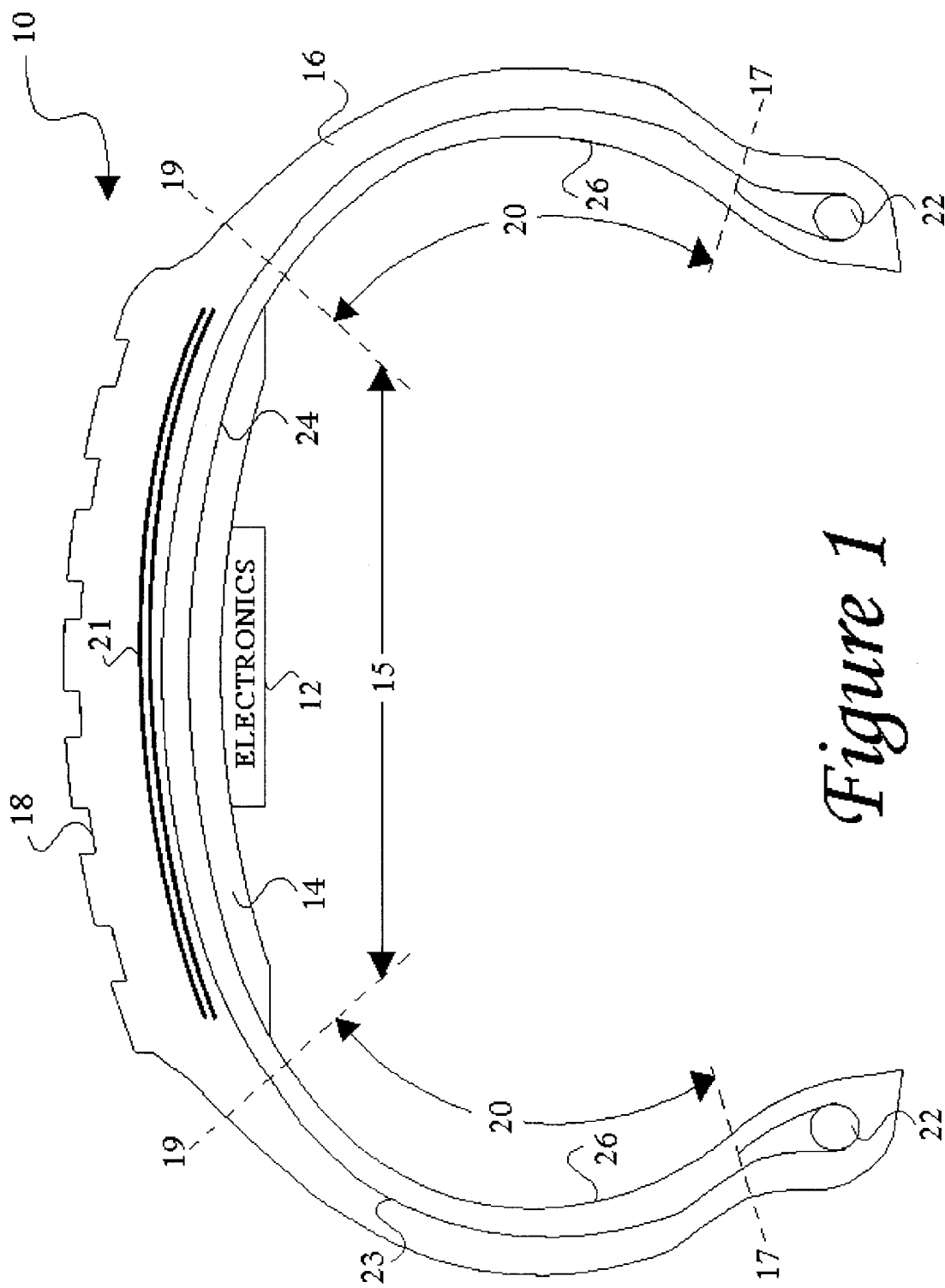
FIG. 1 displays a generally cross-sectional view of an exemplary pneumatic tire structure with integrated self-powered electronic components in accordance with the present subject matter.

Repeat use of reference characters throughout the present specification and appended drawings is intended to represent same or analogous features or elements of the invention.

DETAILED DESCRIPTION OF THE PREFERRED EMBODIMENTS

As discussed in the Brief Summary of the Invention section, the present subject matter is particularly concerned with an improved system for powering electronic systems integrated within a tire structure. A power generation device utilizes piezoelectric technology to convert mechanical strain associated with tire flexure to electric current that is then conditioned and stored in an energy storage device. Sufficient accumulations of such stored energy can then power electronic systems, examples of which include components for identifying various physical tire parameters as well as radio frequency (RF) transmission devices.

A power generation device in accordance with the disclosed technology generally includes components such as a reinforced piezoelectric structure and a power conditioning module. Aspects of an exemplary piezoelectric structure are described with reference to FIGS. 2 and 4 and an exemplary power conditioning module is presented in and discussed with reference to FIG. 5. FIGS. 1, 3A and 3B depict exemplary aspects of integrating such a power generation device with a tire structure. An output of the power generation device may then preferably be used to power electronics systems within a tire or wheel assembly. An example of a tire electronics system, including sensors, a microcontroller, and an RF transmitter is presented in FIG. 7. Aspects of exemplary interaction between a power generation device and tire electronics system is discussed with reference to FIGS. 6A and 6B, respectively. Finally, an exemplary embodiment of a remote receiver configuration for obtaining information transmitted from a tire electronics system is presented with respect to FIG. 8.

Selected combinations of the aforementioned aspects of the disclosed technology correspond to a plurality of different embodiments of the present subject matter. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function. Similarly, certain process steps may be interchanged or employed in combination with other steps to yield additional exemplary embodiments of a method for generating electric power from a rotating tire's mechanical energy.

Reference will now be made in detail to the presently preferred embodiments of the subject system and method of generating power for electronics systems integrated within a tire or wheel assembly. Referring now to the drawings, FIG. 1 provides a generally cross-sectional view of an exemplary pneumatic tire assembly 10 with integrated self-powered electronic components 12 in accordance with the present subject matter. A power generation device (PGD) 14 is preferably provided in conjunction with electronic components internal to a tire structure 16 such that the electronics components are self-powered within the tire assembly 10.

The capabilities of the subject power generation device with piezoelectric materials, as hereafter presented, offer numerous advantages over conventional techniques for providing power within a tire assembly. Antenna beam power scavenging techniques, as previously discussed, are no longer one of limited options to choose from for powering tire electronics. As such, the functional capabilities of many types of tire electronics is generally increased. The option of utilizing batteries for power generation is no longer essential, thus avoiding costly and cumbersome battery replacement. Although the presently disclosed technology provides for a power generation device that enables antenna beam power and batteries to be eliminated, it should be appreciated that a power generation device could employ a hybrid combination of piezoelectric technology and/or batteries and/or antenna beam scavenging to power different selected electronic components within a wheel assembly.

A typical pneumatic tire structure 16 is characterized by a crown 15 which supports an exterior tread portion 18 and sidewalls 20 that extend to bead portions 22. Sidewalls 20 generally extend between section lines 17 and 19 and the tire crown 15 generally extends between the two section lines 19. Tire beads 22 are generally provided such that the tire structure 16 can be effectively seated to the rim of a wheel assembly. An inner liner of air-impermeable material forms the interior surface of the tire, including interior crown surface 24 and interior sidewall surfaces 26. A carcass 23 extends between beads 22 across sidewall portions 20 and crown 15, and under inflation pressure defines the tire's shape and transmits forces for traction and steering. Belt package 21 is provided within tire structure 16 generally along the crown 15.

PGD 14, as illustrated in the exemplary tire assembly embodiment of FIG. 1, may be mounted to the interior crown surface 24 of tire structure 16. This location is generally well-suited for actuation of the piezoelectric fibers within PGD 14 as the exterior tread portion 18 moves along a ground surface and results in flexure of the tire structure 16. This tire flexure coupled with the general mechanical vibrations as the tire assembly 10 moves along a surface enable piezoelectric fibers within the power generation device 14 to generate electric current, which is then conditioned and stored in an energy storage device for powering the tire electronics 12. Although the interior crown surface 24 is a logical location for mounting power generation device 14, it should be appreciated that PGD 14 may also be mounted to a location such as an interior sidewall surface 26. Such location may offer less strain on the piezoelectric fibers within the subject PGD 14 while still providing enough power generation for certain electronic applications. Further, PGD 14 could be mounted and cured within tire structure 16, for example, between carcass 23 and the inner liner provided along surfaces 24 and/or 26. PGD 14 may alternatively be provided in an additional rubber or elastomer casing before being adhered to or embedded in the tire to provide additional protection. Such casing additionally provides for facilitated adhesion of the PGD to a tire structure. The rubber casing may alternatively be provided adjacent to a single side of PGD 14 for support, which may then be adhered to an inner surface of a tire structure. In accordance with the variety of possible locations for PGD 14, it should be understood that the term "integrated" generally encompasses all possible locations, including being mounted on or in a tire structure. Electronic components which are powered by PGD 14 may also be provided in various locations relative to a tire structure, including the above-described options. As such, the term "integrated" should generally encompass all possible locations for such tire electronics, including being mounted on or embedded in a tire structure.

PGD 14 generally includes two main components, a piezoelectric patch and a power conditioning module that includes at least an energy storage device. The piezoelectric patch is subjected to mechanical strains caused by tire rotation, thereby generating charge in the piezoelectric material (as should be understood by one of ordinary skill in the related art). This electric charge is then preferably provided to a power conditioning module where the resulting current is rectified, conditioned, and stored for use with power electronics.

A particular type of piezoelectric material that may be utilized in accordance with the subject power generation device is a piezoelectric fiber composite structure, such as those disclosed in U.S. Pat. Nos. 5,869,189 and 6,048,622 issued to Hagood, IV et al., hereby incorporated by reference for all purposes. A similar example of such Active Fiber Composites (AFCs) that may be utilized in accordance with the present subject matter corresponds to "PiezoFlex" brand technology, such as offered for sale by Continuum Control Corporation. Such active fiber composites offer many advantages relative to known monolithic piezoceramic structures, providing conformable and robust structures with improved actuation and sensing capabilities.

Figure 2:
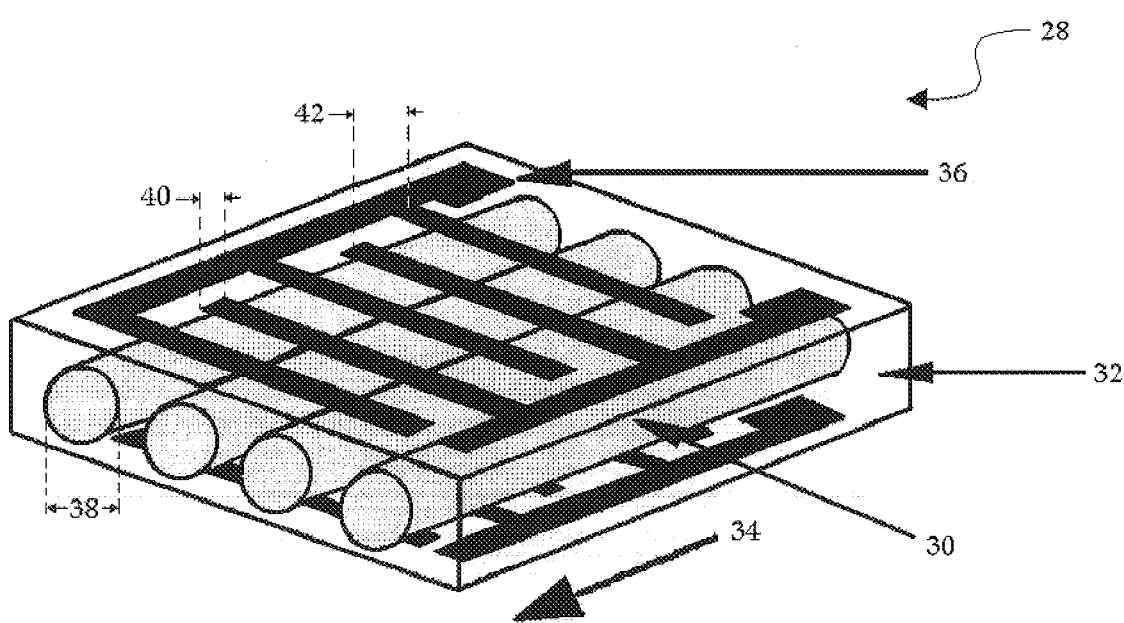
FIG. 2 displays an isometric view of exemplary aspects of a power generation device in accordance with the present subject matter, particularly regarding an exemplary piezoelectric structure.
Figure 3B:
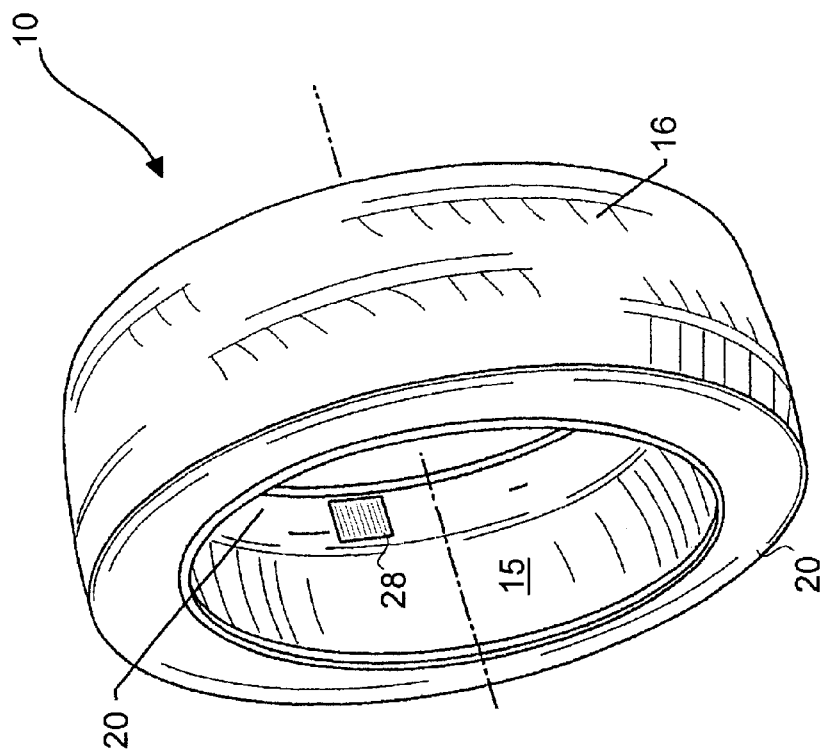
FIGS. 3A and 3B respectively display isometric views of exemplary tire assemblies in accordance with the present subject matter, illustrating respective exemplary configurations for orienting a piezoelectric patch with a pneumatic tire structure.
Figure 3A:
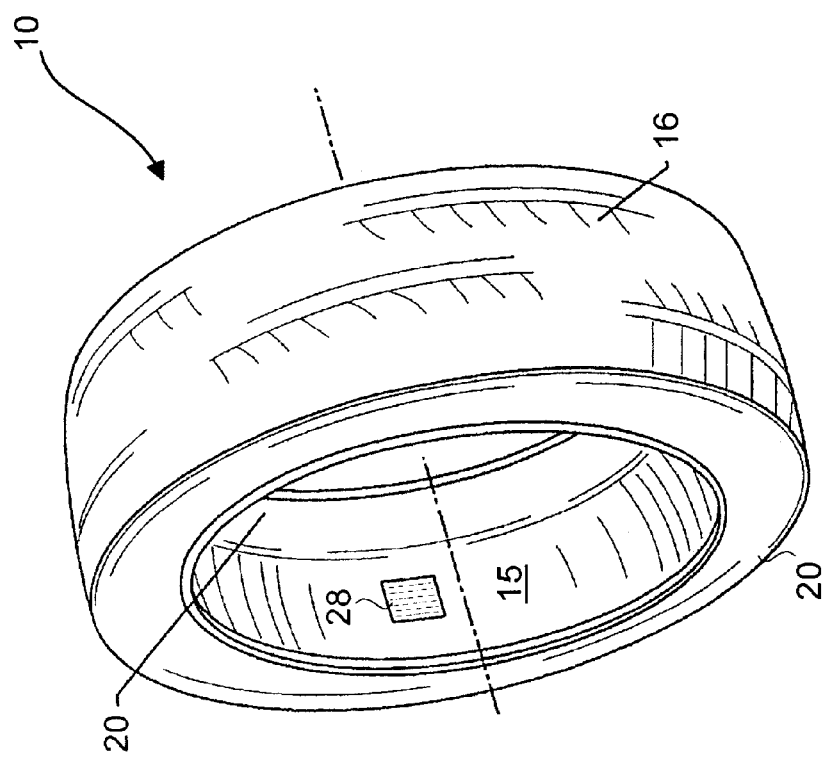

FIG. 2 displays an isometric view of a piezoelectric AFC structure 28 in accordance with exemplary aspects of the presently disclosed power generation. Such a piezoelectric AFC structure 28 includes a plurality of piezoelectric fibers 30 that are unidirectionally aligned to provide actuation and stiffness of AFC structure 28. The fibers 30 are surrounded by a resin matrix 32 of epoxy or polymer, that provides a damage tolerance through load transfer mechanisms. In other words, embedding the piezoelectric fibers 30 in a resin matrix 32 causes the overall mechanical strain to which the piezoelectric materials are subjected to be distributed among the AFC structure 28. The piezoelectric fibers have a common poling direction 34 transverse to their substantially co-parallel axial arrangement.

Referring still to FIG. 2, electrode layers are preferably provided on separate substrates along two opposing surfaces of the fiber/resin matrix configuration to provide electrical input and output to the AFC structure 28. In accordance with the exemplary embodiment of FIG. 2, electrode layers 36 are configured with an interdigital arrangement with alternating finger-to-finger polarity. Such interdigitated electrode layers 36 may be etched onto separate substrate layers (of polyimide or polyester, for example) using screen-printing techniques as known in the art and conductive ink such as silver-loaded epoxy. The alignment of the interdigital electrode configuration of FIG. 2 is designed to enhance the directionality of the electromechanical response of the AFC structure 28, as well as provide for relatively high charge and coupling coefficients. The amount of resin matrix 32 between electrodes 36 and fibers 30 is preferably minimized to achieve greater performance capabilities.

The orientation of the fibers in an AFC structure relative to a tire structure is a particular design factor in accordance with the subject technology. When orienting the fibers along the circumferential direction of a tire, piezoelectric fibers are subjected to generally high tensile strains, but low compressive strains. In accordance with circumferential fiber orientation, it may be preferred to integrate the AFC structure 28 in the crown portion 15 of a tire structure 16, such as illustrated in the exemplary tire assembly embodiment 10 of FIG. 3A. Orienting the fiber direction along the radial direction of a tire couples the primary energy harvesting to the radial strains. This orientation is less likely to cause damage to fibers, but yields a potentially higher susceptibility of compressive depoling of the fibers. In accordance with radial fiber orientation, it may be preferred to integrate the AFC structure 28 in a selected sidewall portion 20 of a tire structure 16, as shown in the exemplary tire assembly embodiment 10 of FIG. 3B. Thus, orienting a piezoelectric patch of a power generation device of the present subject matter radially versus circumferentially along a tire structure may be determined based on the size of the patch and the specific tire environment to which it will be subjected. More particularly, optimal placement and orientation of a piezoelectric AFC structure may be based on factors such as maximum power desired per tire cycle, peak tensile and compressive strains along radial versus circumferential mounting directions, and strain uniformity over an AFC structure at given times.

More specific characteristics of a piezoelectric AFC structure, such as the exemplary embodiment of FIG. 2, can be tailored for different applications. The piezoelectric fibers 30 of AFC structure 28 could comprise numerous different piezoelectric materials, examples of which include quartz, barium titanate, cadmium sulfide, lead zirconate titanate (PZT), polyvinylidene fluoride (PVDF), and polyvinyl chloride (PVC). Some specific PZT materials include PZT 5A, PZT 5H, PZT 4 and PZT 8. It should be appreciated that certain of such exemplary materials may be better suited for use within a tire structure, and material selection may thus depend on certain performance characteristics. It should be noted that technological advances regarding these and other piezoelectric materials may make a given piezoelectric material more suitable for use with vehicular applications, and thus it is within the scope of the present invention to include such newly developed materials in the subject power generation device. For example, current forms of PVDF elastomers may not be suitable for exposure to some of the more extreme conditions within a tire, but certain advances may yield a more suitable PVDF material.

Another specific design constraint corresponds to the diameter 38 of the piezoelectric fibers, which may typically be in a range from about three thousandths of an inch (mils) to about fifteen mils. Other specific dimensions that may be designed for particular applications include the width 40 and pitch 42 of the electrode fingers in interdigital layers 36. An example of electrode finger width 40 corresponds to about twenty-five mils, and an exemplary range for electrode pitch 42 corresponds to from about twenty mils to about one-hundred mils. A specific example of an overall piezoelectric AFC structure for use in accordance with the present subject matter comprises interdigital electrodes with a forty-five mil electrode finger pitch and PZT-5A piezoelectric fibers with a ten mil diameter.

Figure 4:
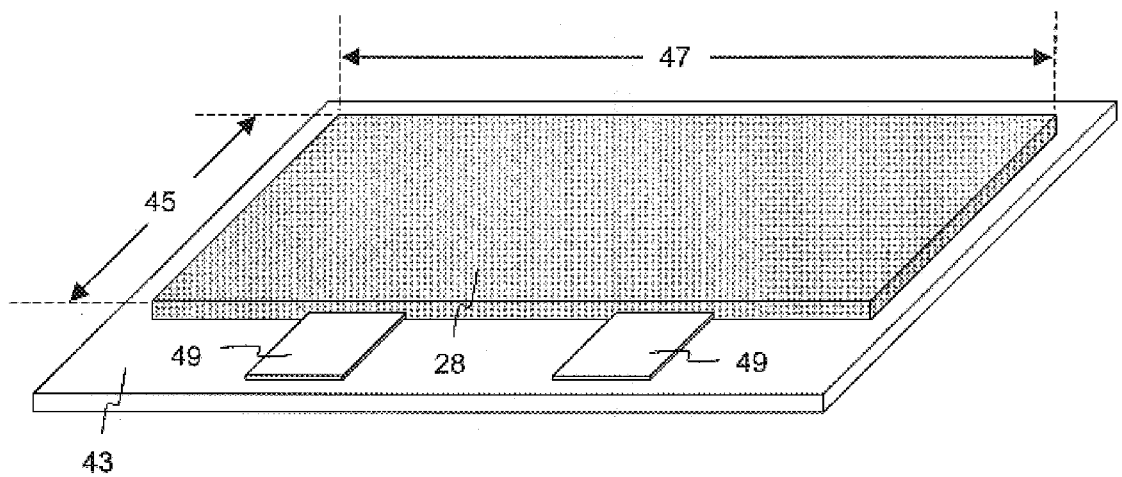
FIG. 4 displays an isometric view of aspects of a power generation device in accordance with the present subject matter, particularly regarding an exemplary support substrate for a piezoelectric structure.
Figure 5:
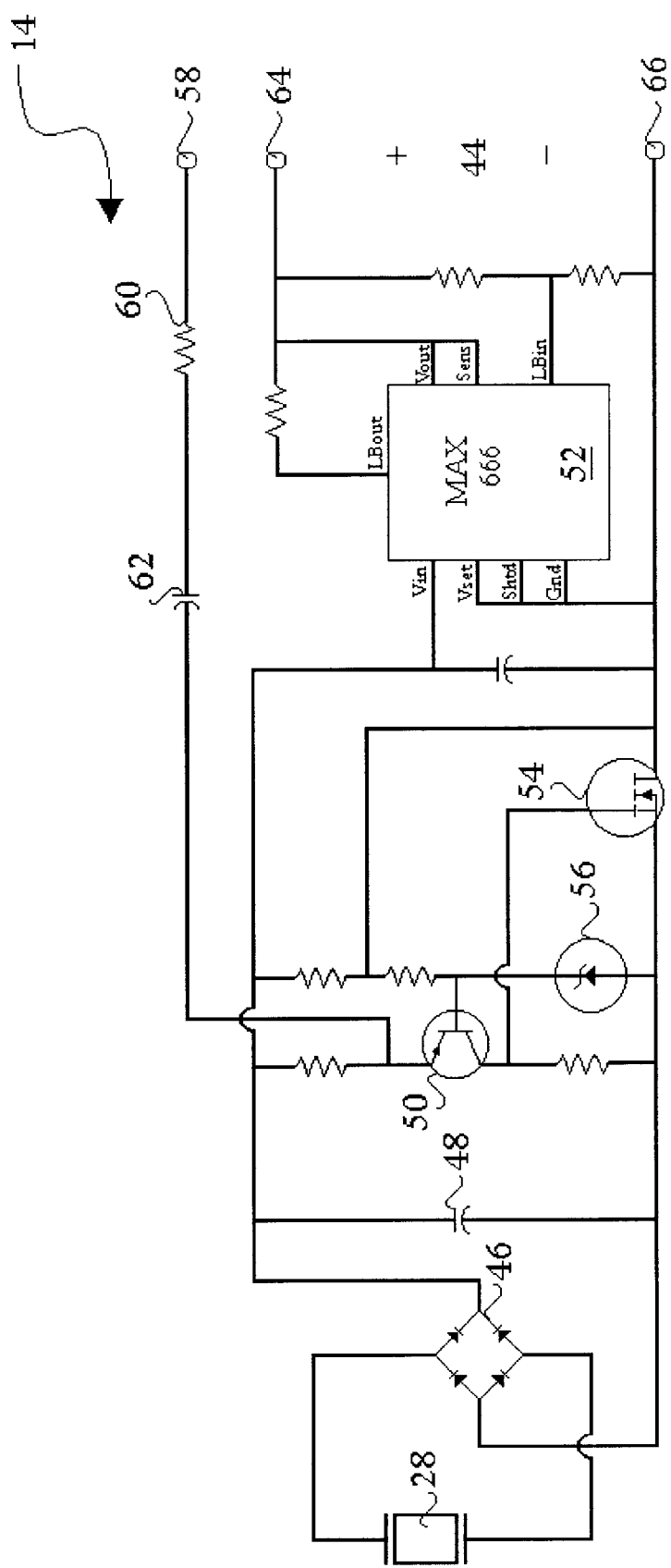
FIG. 5 provides a schematic representation of additional exemplary aspects of a power generation device in accordance with the present subject matter, particularly regarding an exemplary power conditioning module.

Additional design constraints of a piezoelectric AFC structure for use in a power generation device in accordance with the present subject matter may be considered for certain applications. For instance, additional reinforcement may be afforded to an AFC structure 28 by providing it adjacent to a support substrate 43 as illustrated in FIG. 4. AFC structure 28 may be adhered to support substrate 43 in accordance with any of the known methods. The combination of AFC structure 28 with a support substrate 43 facilitates the mechanical distribution of strain forces seen by the piezoelectric fibers within AFC structure 28. By equalizing the strain across AFC structure 28, all piezoelectric fibers generally work at the same tension. Reduced strain levels, such as those below about 3500 $\mu\epsilon$ of planar actuation strain, help to reduce potentially damaging forces to the piezoelectric fibers as well as improve the collective performance level of the AFC structure. Reinforced piezoelectric patches are able to survive for a much longer duration of time within a tire structure and corresponding vehicular environment. In FIG. 4, the size of substrate 43 is larger than that of AFC structure 28, and may also accommodate electrical terminations 49, which are connected to the selected electrode portions of AFC structure 28.

Since support substrate 43 preferably serves to distribute strain as uniformly as possible across AFC structure 28, support substrate 43 is also preferably characterized by uniform thickness and levels of stiffness. The actual thickness of the support substrate may be designed in accordance with the type of material used in the tire structure with which a PGD in accordance with the present subject matter is integrated. An optimum combination of substrate thickness and modulus of elasticity for the tire structure may be designed to ensure both proper actuation of the piezoelectric patch and ability to integrate the PGD with the tire structure in an appropriate manner. In some embodiments of the technology, the stiffness level is uniform but also easily adjustable. Exemplary support substrate 43 may also be characterized in some embodiments by properties such as low hysteresis, chemical inertness, and an inherent ability to survive in a tire environment. A particular example of a material suitable for forming support substrate 43 is a printed circuit board (PCB) material such as fiberglass or other such material. Another example of a suitable material for forming support substrate 43 is a high modulus rubber compound.

There may also be certain design constraints relative to the size and processing capabilities of a piezoelectric patch for integration within a tire structure. There is generally no length constraint of the piezoelectric patch; however, testing has shown that patches over seventy mm in length tend to fail after certain durations of time and/or exposure to certain extreme conditions. A maximum width of about eighty mm may be desired for certain applications. Referring to FIG. 4, exemplary dimensions for piezoelectric patch 28, correspond to a length 45 of about thirty-five mm and a width 47 of about fifty mm, yielding an area of about 1750 mm². It was determined that such a patch area would yield sufficient energy to power the exemplary tire electronics assembly 12 illustrated in FIG. 7, which includes at least a microcontroller, a plurality of sensors, and an RF transmitter. For other tire electronics applications, such as a revolution counter, a patch area of about 750 mm$^2$ would yield sufficient energy. It should be appreciated that a suitable range for a minimum patch area in accordance with the present technology is between about 750 mm$^2$ and about 2500 mm$^2$, depending on the number and type of electronic devices which require power. Of course, piezoelectric patches may always be larger in accordance with the present subject matter, but this sometimes results in somewhat inefficient operation and/or increased susceptibility to fiber damage. In this particular example, the length dimension is intended to correspond with the length of the piezoelectric fibers in the patch structure 28. A maximum thickness of the piezoelectric patch (without a power conditioning module) may be about seven-hundred micrometers, and a maximum mass of about twenty grams (including a piezoelectric patch and a power conditioning module) may be desired for certain applications.

In order for the piezoelectric patch to be bonded to a rubber patch for adhering to a tire interior, the patch must generally be able to survive about one-hundred-seventy degrees Celsius for about thirty minutes while subjected to about twenty bar pressure and also to survive about one-hundred-fifty degrees Celsius for about sixty minutes at about twenty bar pressure. It should be appreciated that these specific constraints may change with the advancement of pertinent materials and adhesion technologies. In addition, a PGD in accordance with the present subject matter should preferably be able to withstand operating conditions from about negative forty degrees Celsius to about one-hundred-twenty-five degrees Celsius, a maximum tire speed of about one-hundred-sixty kph, and an endurance of either about ten years or seven-hundred-thousand miles.

The second main component of PGD 14, in addition to a piezoelectric patch 28 is a power conditioning module, an exemplary embodiment of which is represented in FIG. 3. The major functionality of a power conditioning module in accordance with the present subject matter is to rectify, condition and store the electric charge that is generated in the piezoelectric structure 28. In general, power conditioning modules may be particularly designed for different electronics applications for which power is harvested. In accordance with an exemplary embodiment of a tire monitoring system as disclosed in the present specification, the exemplary power conditioning module of FIG. 3 is designed according to certain dynamic energy requirements. In particular, the exemplary power conditioning module of FIG. 3 is designed such that the voltage output 44 is generally about five volts, the maximum ripple of output voltage 44 is within ±ten mvolts, the minimum duty cycle of output voltage 44 is about sixty seconds, and the maximum duty cycle of output voltage 44 is about five seconds. Additional design requirements within which the exemplary power conditioning module embodiment of FIG. 3 operates correspond to a maximum energy requirement into an electronics system of about four mJoules and a time duration for which an electronics system can operate between about twenty-five msec and about two-hundred msec, depending on the functionality of the electronics system.

With further reference to the exemplary power conditioning module of FIG. 3, electrode layers 36 of piezoelectric structure 28 are connected in parallel with a rectifier, for example full-bridge rectifier 46. Alternative rectifier configurations could correspond to a doubling rectifier or an N-stage voltage multiplier. The rectified signal from rectifier 46 is then stored in electrolytic capacitor 48. A specific example of an electrolytic capacitor 48 suitable for employment in the exemplary power conditioning module of FIG. 3 corresponds to a Panasonic TEL series tantalum capacitor with a capacitance of about forty-seven $\mu$Farads. Other specific electrolytic capacitors may similarly be suitable for utilization as a storage element in accordance with the disclosed power conditioning module. Other energy storage elements, such as rechargeable solid-state batteries, rechargeable chemical batteries, super capacitors, or non-electrolytic capacitors may provide a suitable alternative in certain applications as an energy storage device for a power conditioning module.

Once a sufficient amount of energy has accumulated in electrolytic capacitor 48 (or other suitable energy storage device), an FET transistor 50 acts as a switch to release the stored energy in capacitor 48 to a voltage regulator 52. An example of a voltage regulator suitable for use in the exemplary embodiment of FIG. 3 is a dual-mode five-volt programmable micropower linear voltage regulator such as the MAX666 brand offered for sale by Maxim Integrated Products. Such a voltage regulator may be well suited for electronics systems that may typically have been battery-powered systems, and is able to convert the voltage across capacitor 48 to a regulated five volt output voltage 44. Other voltage regulators, such as micropower switching regulators, which often have higher efficiency levels than linear regulators, may also be used in accordance with the disclosed technology. A diffusion metal oxide semiconductor (DMOS) FET transistor 54 and zener diode 56 are additionally provided in the exemplary power conditioning module of FIG. 3.

Initially, transistors 50 and 54 are off, and the ground at the drain of transistor 54 is floating such that no output voltage 44 is provided. As capacitor 48 charges to a sufficient voltage level (determined by zener diode 56 and the base-emitter junction of transistor 50), transistor 50 turns on, activating transistor 54 and latching transistor 50. At this point, capacitor 48 is allowed to discharge through the circuitry providing a five volt regulated output 44 to an electronics system. Typically, when the application electronics to which output voltage 44 is supplied has finished its useful work, the electronics system sends a signal back at signal path 58, through resistor 60 and capacitor 62 to turn off field effect transistor (FET) 50 and deactivate transistor 54 such that energy can once again begin to accumulate on capacitor 48.

Figure 6A:
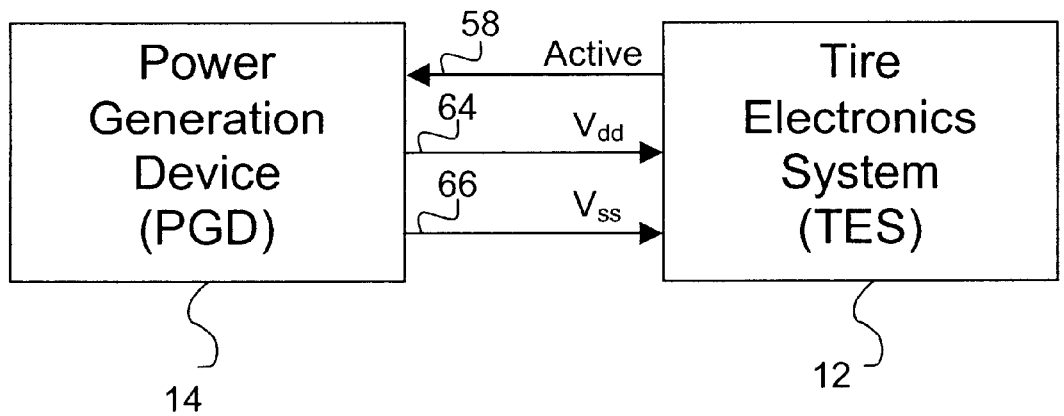
FIG. 6A provides a block diagram representation of exemplary integrated self-powered electronics including a power generation device and a tire electronics system and exemplary interaction thereof in accordance with the present subject matter.
Figure 6B:
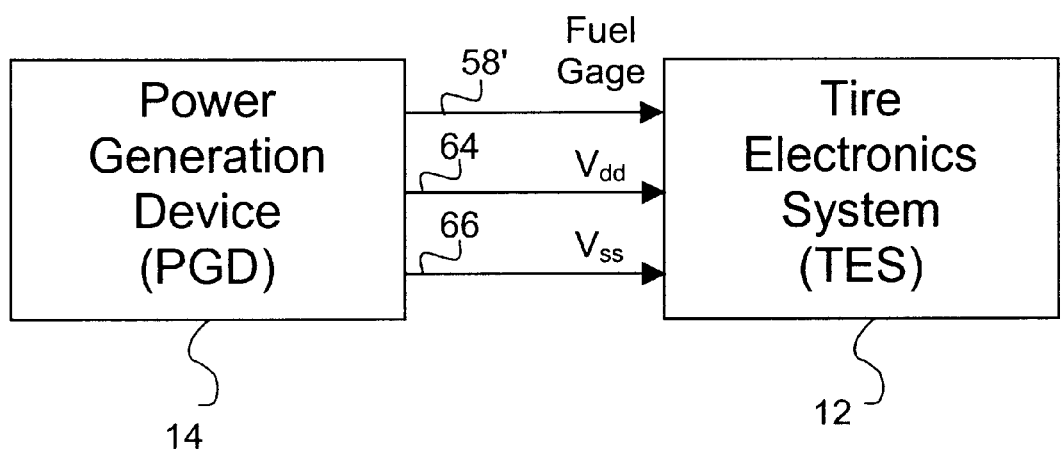
FIG. 6B provides a block diagram representation of exemplary integrated self-powered electronics including a power generation device and a tire electronics system and alternative exemplary interaction thereof in accordance with the present subject matter.

Energy that is generated by PGD 14 may be applied to a variety of devices or different tire electronics systems TESs) in accordance with the present subject matter. FIGS. 6A and 6B, respectively, illustrate exemplary aspects of interaction between a PGD 14 and TES 12.

In accordance with FIG. 6A, energy is allowed to accumulate on an energy storage device in the PGD (for example, capacitor 48) until a sufficient charge has been obtained to perform the desired functions in TES 12. Between power cycles, TES 12 remains unpowered, and thus the activation of TES 12 is governed by the rate at which energy is accumulated in the energy storage device of PGD 14. When sufficient energy is accumulated in PGD 14, a supply voltage "$V_{dd}$" and ground voltage "$V_{ss}$" will be provided at paths 64 and 66 respectively to TES 12. TES 12 will return an "Active" signal along path 58 indicating electronics in TES 12 are currently functioning. When the given electronics in TES 12 are done with their respective tasks, then the "Active" signal goes low and the energy storage device in PGD 14 once again accumulates energy. This cycle will repeat as long as a tire assembly rotates at or above a given threshold speed, which may generally be about twenty kph.

In accordance with the exemplary interaction presented and discussed with reference to FIG. 6B, PGD 14 continuously provides voltage "$V_{dd}$" and ground "$V_{ss}$" signals to TES 12 along with a "Fuel Gage" signal representative of the amount of energy stored in PGD 14. When power is applied to TES 12, a microprocessor or other suitable electronic component can periodically activate itself and monitor the Fuel Gage signal from PGD 14. If a sufficient amount of energy is available in the energy storage device of PGD 14, then TES 12 will engage in a specified task. If a sufficient amount of energy is not available, then TES 12 will go into a low power mode where it consumes less than about one µA of power. The Fuel Gage signal is thereafter periodically checked until energy accumulation is sufficient. This cycle of waiting for sufficient energy accumulation, engaging in a specified task, and returning to low power mode is preferably repeated in a continuous fashion as long as the tire is rotating at or above a given threshold speed.

As previously mentioned, TES 12 could comprise a variety of different electronic applications depending on what sort of components are included in a tire or wheel assembly. A specific example of a tire electronic system 12 corresponds to the electronics assembly depicted in FIG. 7. In particular, such electronics assembly functions as a tire monitoring system that measures temperature and pressure within a tire structure and sends the results by means of a radio frequency (RF) transmitter 68 to a remote receiver location. An example of respective transmitter and receiver modules for utilization with aspects of the disclosed technology corresponds to respective TX2 and RX2 brand UHF FM Data Transmitter and Receiver Modules such as offered for sale by Radiometrix Ltd.

A five-volt power signal "$V_{dd}$", ground signal "$V_{ss}$", and either an "Active" or "Fuel Gage" signal as discussed with reference to FIGS. 6A and 6B are preferably provided from PGD 14 to a microcontroller 70. An example of a suitable microcontroller for use with the disclosed technology is a Microchip brand PIC16LF876 28-pin CMOS RISC microcontroller. Microcontroller 70 is activated when power is applied at input path 64 and then applies power to both temperature sensor 72 and pressure sensor 74 (as well as any additional sensors or appropriate electronic devices in TES 12). An example of a temperature sensor 72 suitable for utilization with the disclosed technology is a LM50 SOT-23 Single-Supply Centigrade Temperature Sensor such as offered for sale by National Semiconductor. An example of a pressure sensor 74 suitable for utilization with the disclosed technology is a Model 1471 PC Board Mountable Pressure Sensor such as offered for sale by ICSensors and Measurement Specialties Inc. Additional sensors 76, 78 and 80, respectively, may measure additional characteristics of a tire structure or corresponding wheel assembly.

Yet another component of the exemplary TES embodiment 12 of FIG. 7 corresponds to a rechargeable battery 81 that may also be configured to receive electric charge generated within piezoelectric structure 28 of PGD 14 and to store additional energy for the integrated tire electronics or other electronic devices in a vehicle. An example of a rechargeable battery for use with the present subject matter is a LiteStar brand solid-state rechargeable battery such as offered for sale by Infinite Power Solutions. Energy stored in battery 81 can typically be stored for a much longer period of time than in other storage devices such as exemplary capacitor 48. Energy stored in battery 81 can be provided to microcontroller 70 when not enough power is generated by actuation of the piezoelectric fibers. Such a situation could occur, for instance, when the vehicle is stationary or when the tires are removed from a vehicle. For example, stored energy may be needed to power TES 12 when a ground crew checks the air pressure in stationary tires on a commercial airliner. Also, battery 81 may serve to provide power to TES 12 such that information for managing tire inventories or retreads is available when a tire is removed from the vehicle.

With further reference to the exemplary TES embodiment 12 of FIG. 7, microcontroller 70 preferably includes an analog-to-digital (A/D) converter that receives information from sensors 72 through 80, respectively, and converts it to digital information. Microcontroller 70 also comprises memory, preferably nonvolatile EEPROM, which stores a unique identification tag that provides sufficient information to identify the tire or wheel assembly. Such an identification variable may be especially useful in tracking tires and vehicles in commercial applications such as trucking fleets, airplanes, etc. Once the desired information, such as that provided by sensors 72 through 80 respectively, is acquired by microcontroller 70 and converted to digital information, microcontroller 70 preferably shuts off power to the sensors and turns on power to RF transmitter 68 at lines 82 and 84 respectively. The desired digitized information is then output on data line 86 to RF transmitter 68, where the data is modulated onto an FM carrier signal and transmitted via antenna 88 to a remote receiver location.

Additional embodiments of tire electronics assemblies that may be powered in accordance with the subject power generation technology may correspond to a combination of many fewer components than the exemplary TES embodiment 12 of FIG. 7 or even to a single component, such as a revolution counter, a single sensor, a rechargeable battery or a flashing light device.

Figure 8:
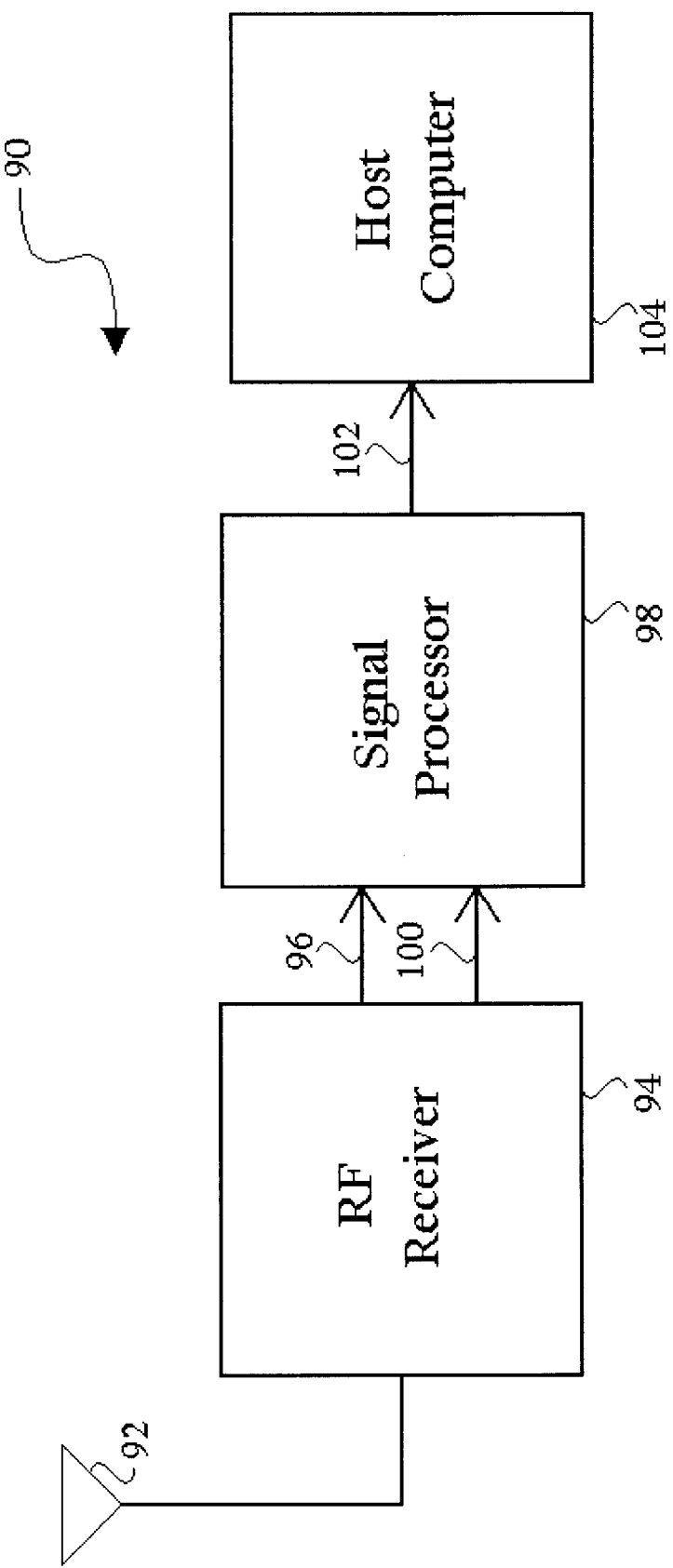
FIG. 8 provides a block diagram representation of an exemplary remote receiver configuration in accordance with the present subject matter.

A vehicle employing tire assemblies with self-powered electronics in accordance with the present subject matter is preferably equipped with a single receiver for obtaining the wirelessly transmitted information from each tire assembly. FIG. 8 provides a block diagram representation of an exemplary remote receiver configuration 90 in accordance with the present subject matter. Receiver antenna 92 facilitates receipt of information transmitted from each wheel assembly and relays the information to RF receiver 94, where the received information is demodulated from its carrier signal and provided on path 96 to signal processor 98. A carrier detection signal is also provided from RF receiver 94 to signal processor 98 via signal path 100. The data outputted from RF receiver 94 and the carrier detection signal are preferably multiplied together in signal processor 98 such that a signal without spurious noise is obtained. This data signal with reduced error probability is then preferably routed to a driver circuit that converts the digital signal to a signal with voltage levels suitable for transmission via an RS232 interface 102 to a host computer 104. Terminal emulation software is preferably provided at host computer 104 such that the data received via RS232 interface 102 is converted to information readily usable by an end user, such as that provided on a readable display module.

It should be appreciated in accordance with the disclosed technology that other electronic devices other than those specifically disclosed in the present specification may be utilized with the subject power generation technology. For instance, it may be desired to transmit other types of information other than temperature, pressure and identification to a remote location. Examples include the number of tire revolutions, amount of tire deflection, vehicle speed, and level of statis and dynamic forces acting on a tire structure. U.S. Pat. No. 5,749,984 discloses other aspects of a tire monitoring system that may be employed with the present subject matter, and such patent is hereby incorporated by reference for all purposes. A tire electronics system may be coupled with a global positioning system (GPS) to pinpoint a vehicle's precise location. A piezoelectric PGD may alternatively be utilized to power light assemblies or feedback systems in a wheel assembly. The number of electronics applications capable of being powered in accordance with aspects of the disclosed technology are vastly numerous and should in no way be limiting to the present subject matter.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed:

1. A tire assembly with integrated self-powered electronic components, said tire assembly comprising:
    a pneumatic tire structure characterized by a crown having an exterior tread portion for making contact with a ground surface, bead portions for seating said tire to a wheel rim, exterior sidewall portions extending between each bead portion and the crown, and interior crown and sidewall surfaces;
    a patch of piezoelectric material integrated with a selected portion of said pneumatic tire structure, said patch of piezoelectric material configured to generate an electric charge therein upon said pneumatic tire structure being subjected to mechanical strains;
    an energy storage device configured to receive said electric charge from said patch of piezoelectric material and to store selected amounts of said electric charge therein; and
    an electronics assembly including said electronic components connected to said energy storage device such that selected electronic components of said electronics assembly are powered by the electric charge stored in said energy storage device.

2. A tire assembly as in claim 1, wherein said piezoelectric material is selected from the group consisting of quartz, barium titanate, cadmium sulfide, lead zicronate titanate (PZT), polyvinylidene fluoride (PVDF), and polyvinyl chloride (PVC).

3. A tire assembly as in claim 1, further including a support substrate provided adjacent to said patch of piezoelectric material for distributing the strain to which said piezoelectric material is subjected in a substantially uniform fashion across said patch of piezoelectric material.

4. A tire assembly as in claim 3, further including a rubber casing provided adjacent to at least one side of the combined support substrate and patch of piezoelectric material to facilitate integration with said pneumatic tire structure.

5. A tire assembly as in claim 2, wherein said patch of piezoelectric material comprises a fiber composite structure with a plurality of piezoelectric fibers embedded in an epoxy matrix.

6. A tire assembly as in claim 5, wherein the piezoelectric fibers of said fiber composite structure are all aligned in a generally unidirectional fashion and provided in a radial orientation as integrated with a selected sidewall portion of said pneumatic tire structure.

7. A tire assembly as in claim 5, wherein the piezoelectric fibers of said fiber composite structure are all aligned in a generally unidirectional fashion and provided in a circumferential orientation as integrated with a selected crown portion of said pneumatic tire structure.

8. A tire assembly as in claim 1, further comprising a power conditioning module provided in conjunction with said energy storage device for rectifying an electric current signal representative of said electric charge generated within the patch of piezoelectric material, providing the rectified current signal to said energy storage device, and generating a regulated voltage output.

9. A tire assembly as in claim 8, wherein said electronics assembly comprises a rechargeable battery.

10. A tire assembly as in claim 1, wherein said electronics assembly comprises at least one sensor to monitor predetermined characteristics of said pneumatic tire structure.

11. A tire assembly as in claim 10, wherein said electronics assembly comprises a radio frequency (RF) device for relaying selected sensor information and additional tire identification information to a remote location.

12. A tire assembly as in claim 10, wherein said predetermined characteristics are selected from the group consisting of temperature, pressure, number of tire revolutions, vehicle speed, and level of static and dynamic forces acting on a tire structure.

13. A tire assembly as in claim 1, wherein the dimensions defining said piezoelectric patch result in a patch area of between about 750 mm$^2$ and about 2500 mm$^2$.

14. A tire assembly as in claim 1, wherein said energy storage device is a capacitor.

15. A tire assembly with integrated self-powered electronic components, said tire assembly comprising:
    a pneumatic tire structure characterized by a crown having an exterior tread portion for making contact with a ground surface, bead portions for seating said tire to a wheel rim, exterior sidewall portions extending between each bead portion and the crown, and interior crown and sidewall surfaces;
    a patch of piezoelectric material carried by a selected portion of said pneumatic tire structure, said patch of piezoelectric material configured to generate electric charge therein upon said tire structure being subjected to mechanical strains;
    a support substrate provided adjacent to said patch of piezoelectric material for distributing the strain to which said piezoelectric material is subjected in a substantially uniform fashion within said patch of piezoelectric material;
    an energy storage device configured to receive said electric charge generated in said patch of piezoelectric material and to store selected amounts of said electric charge therein; and
    an electronics assembly including said electronic components connected to said energy storage device such that selected electronic components of said electronics assembly are powered by the electric charge stored in said energy storage device.

16. A tire assembly as in claim 15, wherein said piezoelectric material is selected from the group consisting of quartz, barium titanate, cadmium sulfide, lead zirconate titanate (PZT), polyvinylidene fluoride (PVDF), and polyvinyl chloride (PVC).

17. A tire assembly as in claim 16, wherein said patch of piezoelectric material comprises a fiber composite structure with a plurality of piezoelectric fibers embedded in an epoxy matrix.

18. A tire assembly as in claim 15, further comprising a power conditioning module provided in conjunction with said energy storage device for rectifying an electric current signal generated within the patch of piezoelectric material, providing the rectified current signal to said energy storage device, and generating a regulated voltage output.

19. A tire assembly as in claim 18, further comprising a rechargeable battery configured to receive said regulated voltage output.

20. A tire assembly as in claim 15, wherein said electronics assembly comprises sensors for monitoring the temperature and pressure of said pneumatic tire structure.

21. A tire assembly as in claim 20, wherein said electronics assembly further comprises a radio frequency (RF) device for relaying selected sensor information and additional tire identification information to a remote location.

22. A tire assembly as in claim 15, wherein the length and width dimensions defining said piezoelectric patch result in a patch area of between about 750 mm$^2$ and about 2500 mm$^2$ and wherein said support substrate is characterized by length and width dimensions that are greater than or equal to the respective dimensions of said piezoelectric patch.

23. A tire assembly as in claim 15, wherein said support substrate comprises fiberglass.

24. An electronics assembly for integration with a pneumatic tire structure designed to measure and transmit information relating to selected tire conditions, said electronics assembly comprising:

an active piezoelectric fiber composite structure integrated in the pneumatic tire structure, wherein said piezoelectric fiber composite structure is characterized by a plurality of piezoelectric fibers embedded in an epoxy matrix and provided between at least two electrode layers;

a support substrate provided adjacent to said active piezoelectric fiber composite structure for distributing the strain to which said piezoelectric fibers are subjected in a substantially uniform fashion within said piezoelectric fiber composite structure;

a power conditioning module electrically coupled to selected electrode layers of said piezoelectric fiber composite structure for receiving electric charge generated within the piezoelectric fibers, for storing the charge in an energy storage device within the power conditioning module, and for generating a regulated voltage output;

a plurality of sensors for determining information about preselected tire conditions, wherein said sensors are powered by the regulated voltage output from said power conditioning module;

a microcontroller connected to said power conditioning module and to said plurality of sensors for processing the information received from said sensors, and for generating select information indicative of preselected tire conditions; and an RF transmitter electrically connected to said microcontroller for receiving select information from said microcontroller, modulating the select information to a carrier signal, and transmitting the select information to a remote receiver location.

25. An electronics assembly as in claim 24, wherein said energy storage device is a device selected from the group consisting of an electrolytic capacitor, a non-electrolytic capacitor, a super capacitor, a rechargeable solid-state battery, and a rechargeable chemical battery.

26. An electronics assembly as in claim 24, wherein selected of said plurality of sensors provide information about the temperature and pressure within a pneumatic tire structure.

27. An electronics assembly as in claim 24, further comprising a rechargeable battery connected to the regulated voltage output from said power conditioning module.

28. An electronics assembly as in claim 24, further comprising a tire revolution counter powered by the regulated voltage output from said power conditioning module.

29. A tire assembly with integrated power generation features, said tire assembly comprising:

a pneumatic tire structure characterized by a crown having an exterior tread portion for making contact with a ground surface, bead portions for seating said tire to a wheel rim, exterior sidewall portions extending between each bead portion and the crown, and interior crown and sidewall surfaces;

a patch of piezoelectric material integrated with a selected portion of said pneumatic tire structure, said patch of piezoelectric material configured to generate an electric charge therein upon said pneumatic tire structure being subjected to mechanical strains;

at least one sensor for determining information about preselected tire conditions, wherein said at least one sensor is powered by the electric charge generated in said patch of piezoelectric material; and an antenna coupled to said at least one sensor for radiating and receiving RF signals representative of said information about preselected tire conditions determined by said at least one sensor.

30. A tire assembly as in claim 29, further comprising a support substrate provided adjacent to said patch of piezoelectric material for distributing the strain to which said piezoelectric material is subjected in a substantially uniform fashion within said patch of piezoelectric material.

31. A tire assembly as in claim 29, wherein said at least one sensor provides information about the temperature and pressure within said pneumatic tire structure.

32. A tire assembly as in claim 29, further comprising a microcontroller powered by the electric charge generated in said patch of piezoelectric material and coupled to said at least one sensor for processing information received from said at least one sensor and for generating select information indicative of said preselected tire conditions.

33. A tire assembly as in claim 32, further comprising an RF transmitter coupled to said microcontroller for receiving select information from said microcontroller, modulating the select information to a carrier signal, and transmitting the select information via said antenna to a remote receiver location.

* * * * *